(12) United States Patent
Eppich

(10) Patent No.: US 8,354,833 B2
(45) Date of Patent: Jan. 15, 2013

(54) METHOD FOR CHARACTERIZING DIELECTRIC LOSS TANGENT

(75) Inventor: Raymond Dean Eppich, Plano, TX (US)

(73) Assignee: Raytheon Company, Waltham, MA (US)

( * ) Notice: Subject to any disclaimer, the term of this patent is extended or adjusted under 35 U.S.C. 154(b) by 417 days.

(21) Appl. No.: 12/750,529

(22) Filed: Mar. 30, 2010

(65) Prior Publication Data

US 2011/0241710 A1    Oct. 6, 2011

(51) Int. Cl.
   *G01R 19/00*    (2006.01)
(52) U.S. Cl. ..................... 324/76.11; 324/641
(58) Field of Classification Search ......... None
   See application file for complete search history.

(56) References Cited

U.S. PATENT DOCUMENTS

| | | | |
|---|---|---|---|
| 6,630,833 B2 * | 10/2003 | Scott | 324/637 |
| 7,915,900 B2 * | 3/2011 | Yamazawa | 324/600 |
| 2009/0091340 A1 * | 4/2009 | Kim et al. | 324/722 |

\* cited by examiner

*Primary Examiner* — Minh N Tang
(74) *Attorney, Agent, or Firm* — Christie, Parker & Hale, LLP

(57) ABSTRACT

A method for characterizing dielectric loss tangent of a dielectric material. The method includes: introducing an incident wave in a mismatched transmission line; measuring a first insertion loss from a first resulting standing wave, at a given frequency; augmenting the mismatched transmission line with the dielectric material; introducing the incident wave in the transmission line augmented with the dielectric material; measuring a second insertion loss from a second resulting standing wave, at the given frequency; and calculating the dielectric loss tangent based on the differences between the first and second measured insertion losses.

20 Claims, 11 Drawing Sheets

FIG. 4

Measured insertion loss S(23,22) non-coated and S(25,24) coated, modeled insertion loss S(7,6)

METHOD FOR CHARACTERIZING DIELECTRIC LOSS TANGENT

FIELD OF THE INVENTION

The present invention relates generally to dielectric materials and more specifically to a method for characterizing dielectric loss tangent of dielectric materials.

BACKGROUND

Loss tangent is a parameter of a dielectric material that quantifies electromagnetic energy dissipation in the dielectric material. More specifically, the term refers to the angle in a complex plane between the resistive component of an electromagnetic field and its reactive component. For many applications, such as antenna design, printed circuit boards (PCB), hermetic packaging, etc, the electromagnetic energy can be considered as electromagnetic waves propagating either through free space, in a transmission line, in a waveguide or in a microstrip line. For mechanical or structural support of electrical conductors, dielectric materials are often used in these applications.

For example, in the case of an antenna system, because the electromagnetic wave travels through different parts of the antenna system (radio, feed line, antenna, free space, etc.), it may encounter differences in impedance. At each interface, depending on how well the impedance is matched, some portion of the wave's energy reflects back to the source of the wave, forming a standing wave in the feed line. Here, a standing wave is an electromagnetic wave that remains in a constant position, because of interference between two waves (one being the reflection of the other one) traveling in opposite directions. However, for waves having equal amplitudes and traveling in opposing directions, there is no net propagation of energy. Impedance matching deals with minimizing impedance differences at each interface to reduce ratio of maximum power to minimum power, that is, the standing wave ratio (SWR), and to maximize power transfer through each part of the antenna system.

Complex impedance of an antenna is related to the electrical length of the antenna at the wavelength in use. The impedance of an antenna can be matched to the feed line and radio by adjusting the impedance of the feed line, for example, by adjusting the length and width of the feed line. A Smith chart is a graphical chart to assist in solving problems with transmission lines and matching circuits. The Smith chart is used as a graphical indication of how many radio frequency (RF) parameters behave at different frequencies. It can also be used to represent many parameters including impedances, admittances, reflection coefficients, and $S_{nn}$ scattering parameters, among others.

There have been many attempts to measure or characterize the dielectric loss tangent of dielectric materials for different applications by complicated methods. These methods include filling a waveguide with the dielectric material of interest and measuring the radiation loss in the material. The measured radiation loss with the dielectric material is then compared with the measured radiation loss in the waveguide without the dielectric material to determine the loss due to the dielectric material of interest. Once the radiation loss to the dielectric material is determined, a loss tangent of the determined loss is calculated, for example, by a computer program. Other methods include resonant techniques such as waveguide resonators filled with the dielectric material, and resonant ring measurements.

However, these complicated methods are either not accurate and/or hard to implement, especially at higher frequency ranges. Resonant techniques typically measure insertion loss at very low signal resonant peaks. These methods are not adequate in measuring differences in loss involving small changes in dielectric material. At higher frequencies, measurement calibration inaccuracy limits the accuracy of the measurement for small signals levels. Therefore, a very limited frequency set is measured per structure with these conventional techniques. Furthermore, conventional techniques include filling waveguide with the dielectric material of interest and measuring antenna radiation loss. However, a coating is usually too thin to use in these bulk measurement techniques.

Therefore, there is a need for a less complicated and more accurate method for characterizing dielectric loss tangent of dielectric materials.

SUMMARY OF THE INVENTION

In some embodiments, the present invention is an accurate method for characterizing dielectric loss tangent of dielectric materials, for example, in radar and PCB design applications.

In some embodiments, the present invention is a method for characterizing dielectric loss tangent of a coating on a dielectric material. The method includes: introducing an incident wave in a mismatched transmission line; measuring a first insertion loss from a first resulting standing wave, at a given frequency; augmenting the mismatched transmission line with the dielectric coating material; introducing the incident wave in the transmission line augmented with the dielectric material; measuring a second insertion loss from a second resulting standing wave, at the given frequency; and calculating the dielectric loss tangent of the coating based on the differences between the first and second measured insertion losses.

In some embodiments, the present invention is a method for characterizing dielectric loss tangent of a dielectric material. The method includes: modeling a mismatched transmission line for an electromagnetic simulation computer program; introducing an incident wave in the modeled mismatched transmission line; measuring a first insertion loss from a first resulting standing wave, at a given frequency; augmenting the modeled mismatched transmission line with the dielectric material; introducing the incident wave in the modeled transmission line augmented with the dielectric material; measuring a second insertion loss from a second resulting standing wave, at the given frequency; and calculating the dielectric loss tangent based on the differences between the first and second measured insertion losses by the electromagnetic simulation computer program. The method may further include validating accuracy of the modeled transmission line.

Augmenting the mismatched transmission line with the dielectric material may include placing a dielectric substrate or a dielectric coating in the mismatched transmission line.

DETAILED DESCRIPTION

In some embodiments, the present invention employs a low characteristic impedance transmission line structure compared to the standard reference 50 ohm characteristic impedance used for RF signals. A standing wave is induced from the constructive and destructive interference of an incident signal to the reflected signal, due to the mismatch of the transmission line characteristic impedance relative to the 50 ohm reference termination impedance. Accordingly, for a S21 measurement, the measured signal over frequency will have a standing wave pattern having peaks and valleys every half wavelength of the transmission line length. The waveform travels multiple times over the transmission path and therefore the insertion loss is magnified by the multiple trips of the waveforms. A transmission line with a characteristic impedance higher than the reference 50 ohm characteristic impedance that is typically used for RF signals can also be used.

In some embodiments, the present invention is a method for characterizing dielectric loss tangent of a substrate dielectric material. The method includes modeling matched and mismatched transmission lines with an electromagnetic simulation computer program; introducing an incident wave in the fabricated matched and mismatched transmission lines and measuring the insertion losses. The substrate loss tangent can be extracted from a insertion loss comparison over a frequency range using a electromagnetic simulation computer program.

In some embodiments, the present invention is a method for characterizing dielectric loss tangent of a dielectric material. The method includes: modeling a mismatched transmission line for an electromagnetic simulation computer program; introducing an incident wave in the modeled mismatched transmission line; measuring a first insertion loss from a first resulting standing wave, at a given frequency; augmenting the modeled mismatched transmission line with the dielectric material; introducing the incident wave in the modeled transmission line augmented with the dielectric material; measuring a second insertion loss from a second resulting standing wave, at the given frequency; and calculating the dielectric loss tangent based on the differences between the first and second measured insertion losses by the electromagnetic simulation computer program. The method may further include validating accuracy of the modeled transmission line.

Figure 1A:
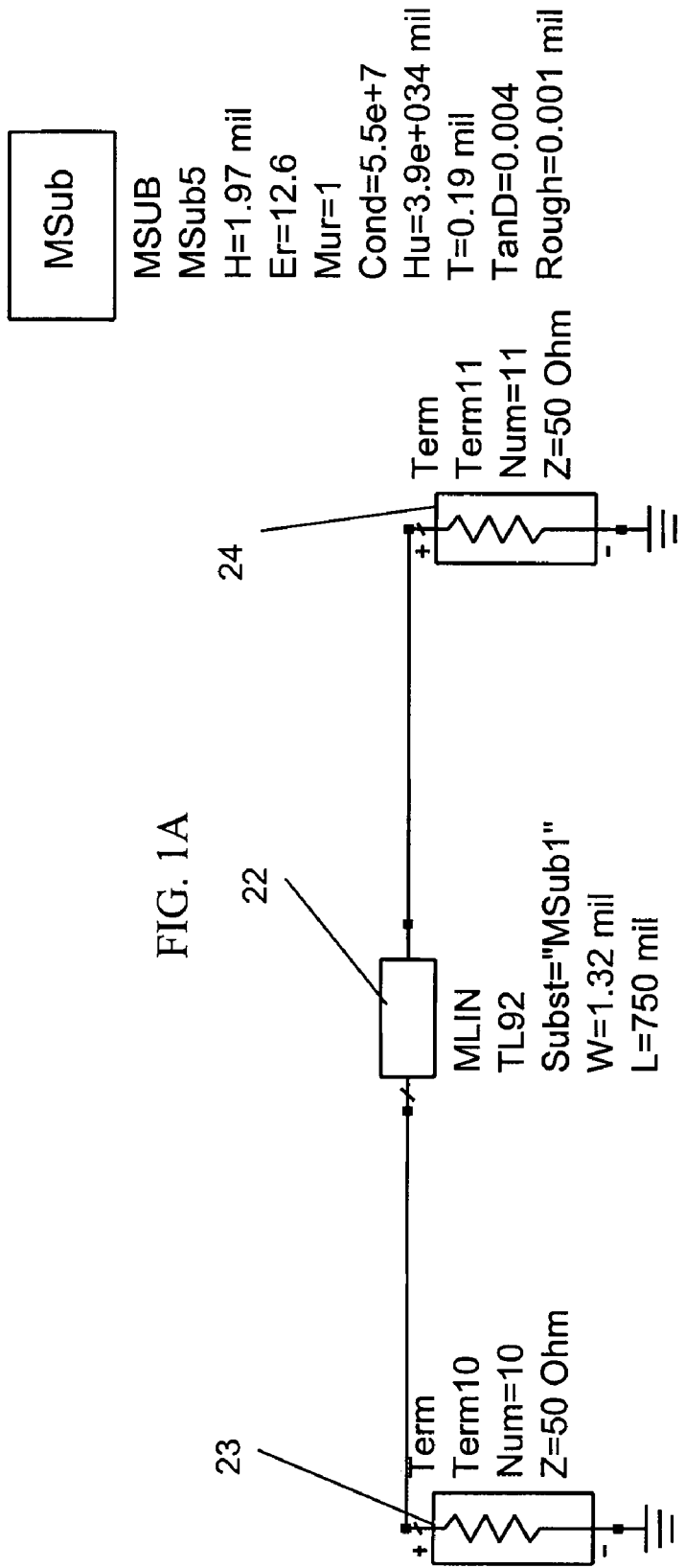
FIGS. 1A and 1B Show a 50 ohm impedance transmission line, according to some embodiments of the present invention.
Figure 1B:
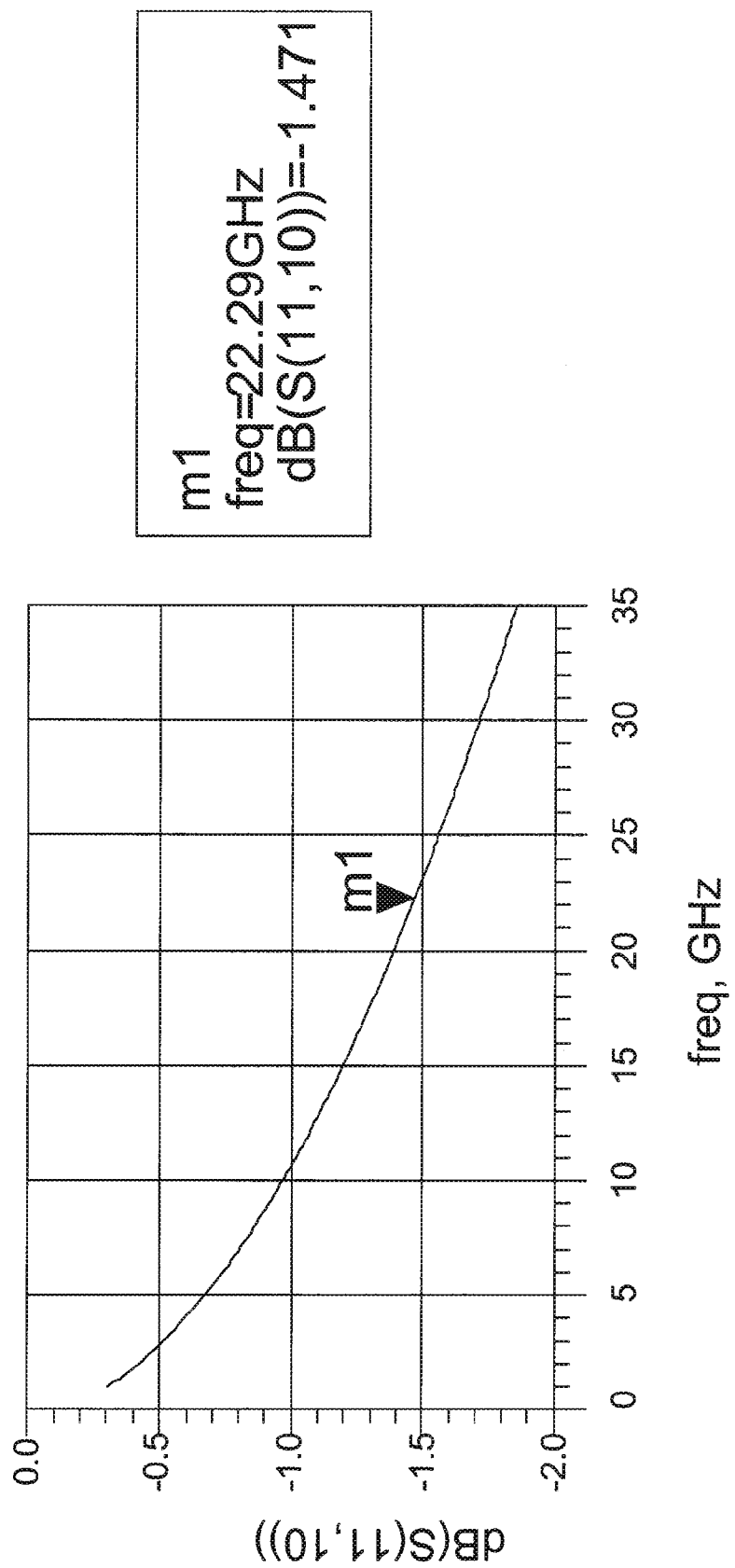

FIGS. 1A and 1B show a 50 ohm impedance transmission line, according to some embodiments of the present invention. A 50 ohm line can serve as a baseline in some embodiments of the present invention. As shown, a modeled 50 ohm impedance microstrip transmission line 22 is provided on a 2 mil thick Gallium Arsenide (GaAs) substrate. A 50 ohm characteristic impedance transmission line provides a minimum signal path length due to no reflections of the induced signal. The transmission line 22 is terminated at both ends with two 50 ohm termination impedances 23 and 24. There is no impedance mismatch between this 50 ohm impedance transmission line and the 50 ohm termination impedances. This results in a minimum insertion loss due to impedance mismatch loss. At marker point m1, an insertion loss of 1.47 dB at 22.29 GHz is shown in FIG. 1B.

Figure 2A:
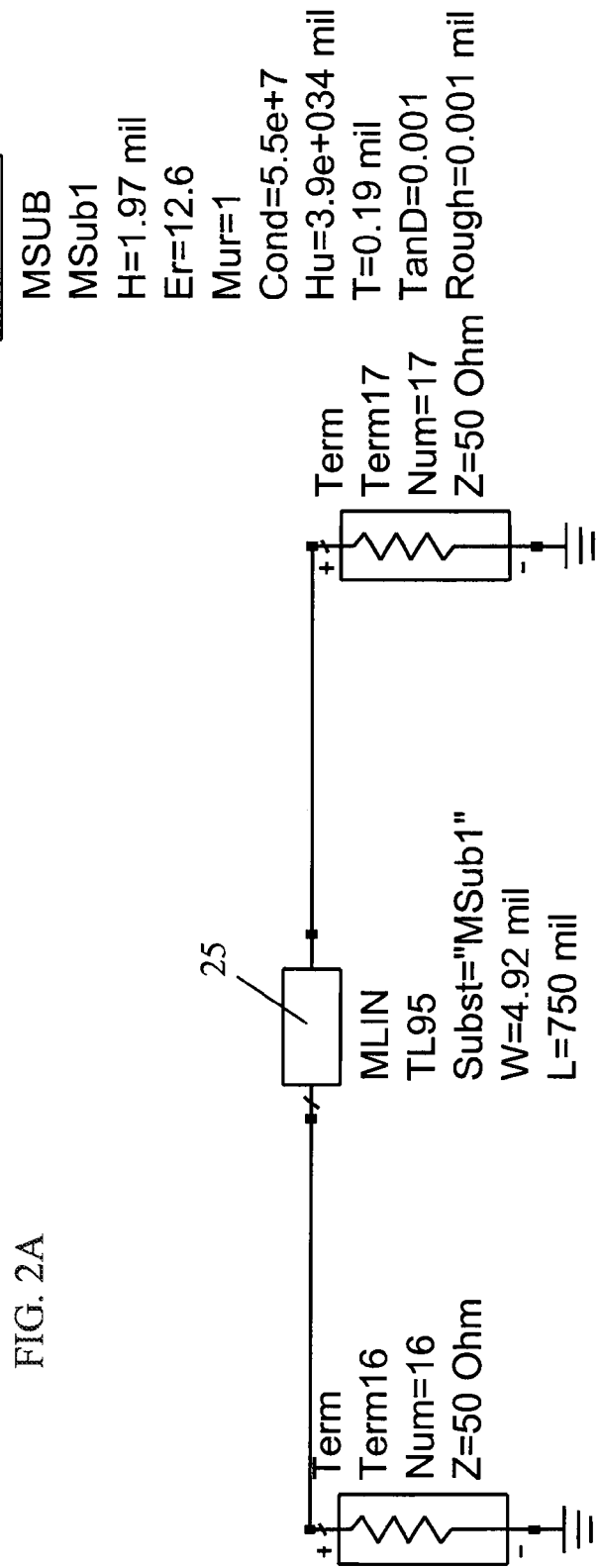
FIGS. 2A and 2B show a 31.5 ohm impedance transmission line model and the corresponding modeled insertion loss, according to some embodiments of the present invention.
Figure 2B:
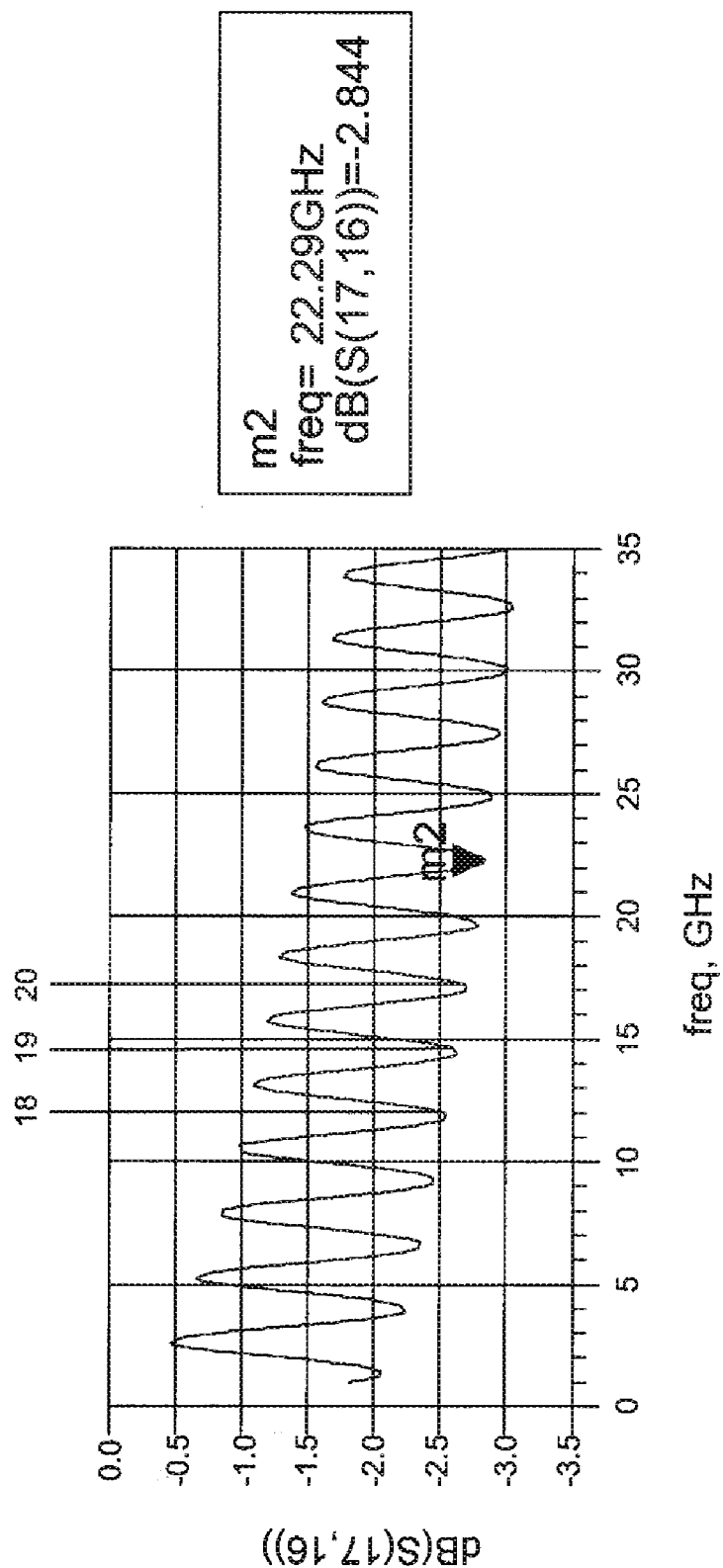

FIGS. 2A and 2B show a 31.5 ohm impedance transmission line model and the corresponding modeled insertion loss, according to some embodiments of the present invention. In this example, an approximately 31.5 ohm impedance microstrip transmission line 25 is modeled on an approximately 2 mil height GaAs substrate, as depicted in FIG. 2A. The transmission line is terminated at both ends with two 50 ohm termination impedances 26 and 27. Accordingly, there is an impedance mismatch between the 31.5 ohm impedance transmission line and the two 50 ohm termination impedances, resulting in standing wave with peaks and valleys. As shown in FIG. 2B, an increased insertion loss is observed (from the model) due to the waveform traveling over multiple path lengths due to reflections of the wave. For example, at the marker point 2, an insertion loss 2.844 dB at 22.29 GHz (higher frequencies are also applicable) is shown in FIG. 2B. This valley corresponds to out-of phase destructive interference of the multiple waveform reflections in the transmission path.

Figure 2C:
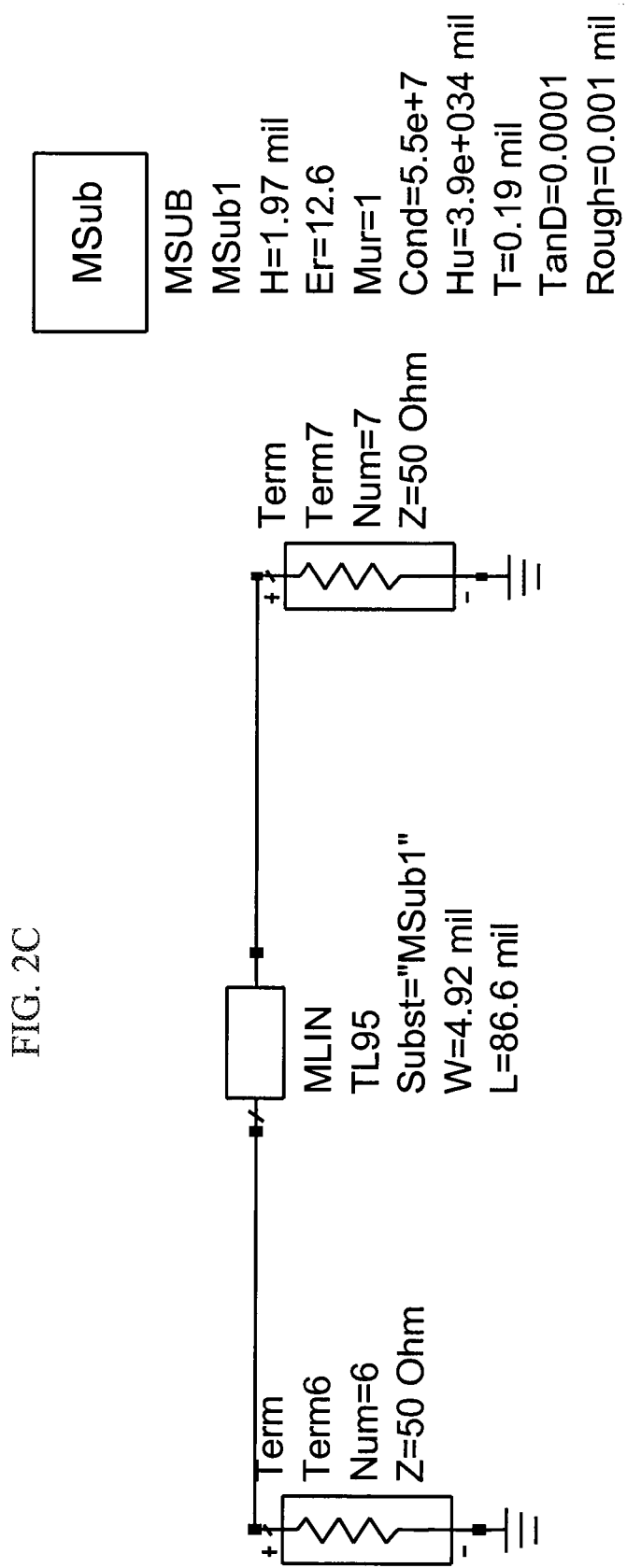
FIGS. 2C and 2D show a 31.5 ohm impedance model transmission line and the corresponding measured insertion loss, according to some embodiments of the present invention.
Figure 2D:
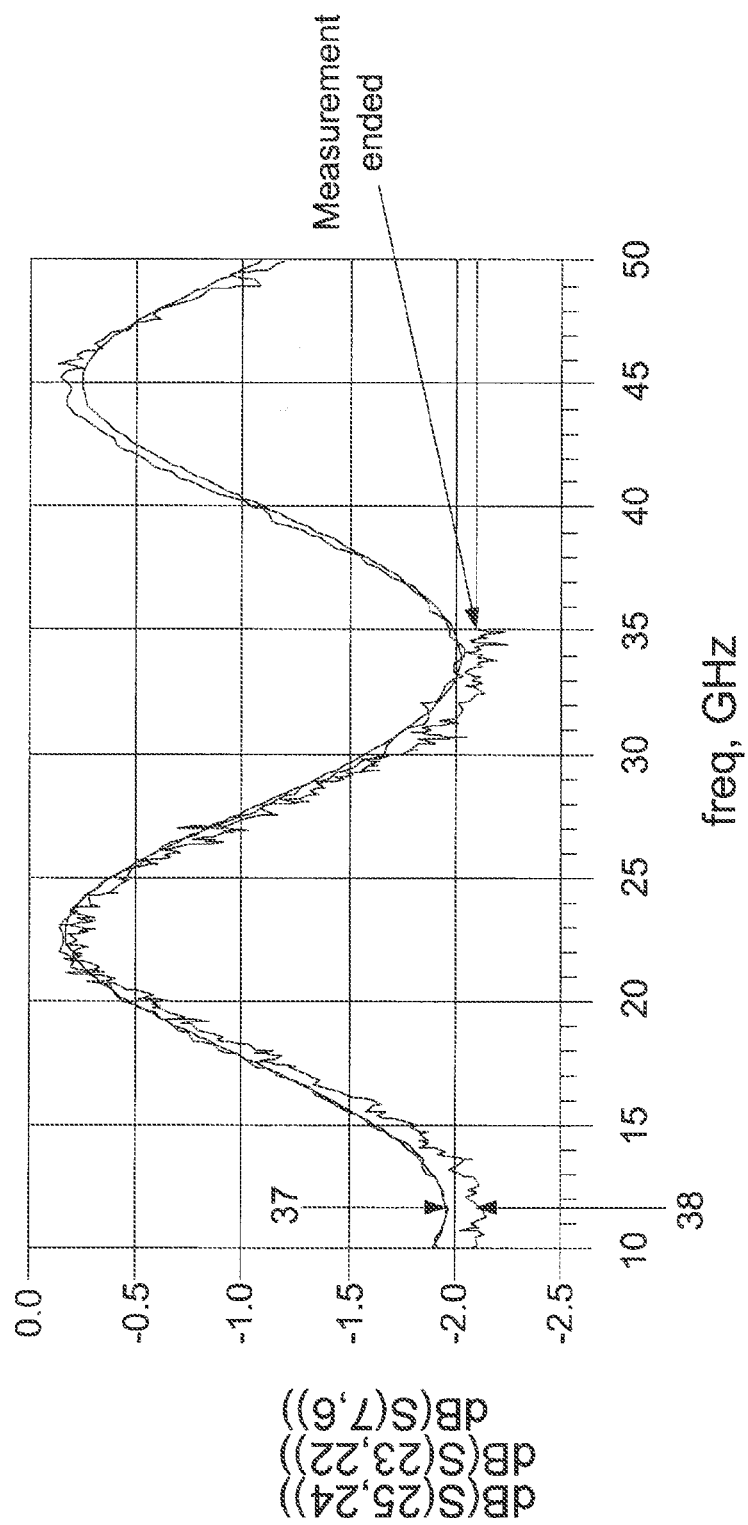

FIG. 2C shows a model for a short length of 31.5 ohm impedance transmission line and the corresponding measured insertion loss, according to some embodiments of the present invention. In FIG. 2C, a 31.5 ohm impedance microstrip transmission line 25 is modeled on a 2 mil height GaAs substrate. FIG. 2D shows measured and modeled data for the insertion loss delta for this short section of microstrip transmission line with and without a thin coating application. The fabricated 31.5 ohm impedance transmission line had a width of 4.92 mil and length of 86.6 mil. The modeled non-coated S(7,6) insertion loss agrees with the measured non-coated S(23,22), as shown by point 37 in FIG. 2D. These non-coated modeled and measured insertion loss results overlap each other and thus validating the accuracy of the model. A thin low loss coating was then applied to the 31.5 ohm impedance transmission line. Measured S(25,24) shows the increased insertion loss at point 38. For a very small variation in dielectric loss tangent in the transmission line media, which includes the dielectric material of interest, a sizeable difference is then measured in delta measurements between similar frequency peaks and valleys.

The measurement results can be related back to predicted performance generated by an existing computer program model using conventional electromagnetic simulation programs such as Momentum™, Sonnet™, etc. in order to determine the loss tangent of the dielectric material. This technique measures loss deltas at much higher signal levels and thus improves accuracy of the loss tangent characterization. By adjusting the length of transmission line to at least a half wavelength, characterization at specific frequency point (directly associated with the half wavelength) can be obtained. This technique can be applied for characterization over a broad frequency range by measuring insertion loss at multiple half wavelength points (see FIG. 2B, 18 thru 20). Here, multiple frequency points can be measured for loss tangent with the same transmission line structure.

Although, in this embodiment, a lower (31.5 ohm) impedance is used with respect to the conventional 50 ohm termination impedance for a RF transmission line, larger impedances are also applicable to establish an impedance mismatch to create the standing wave. However, much larger impedances may be harder to implement with fabrication and have increased insertion loss due to higher conductor loss which makes the loss tangent extraction more difficult.

Figure 3A:
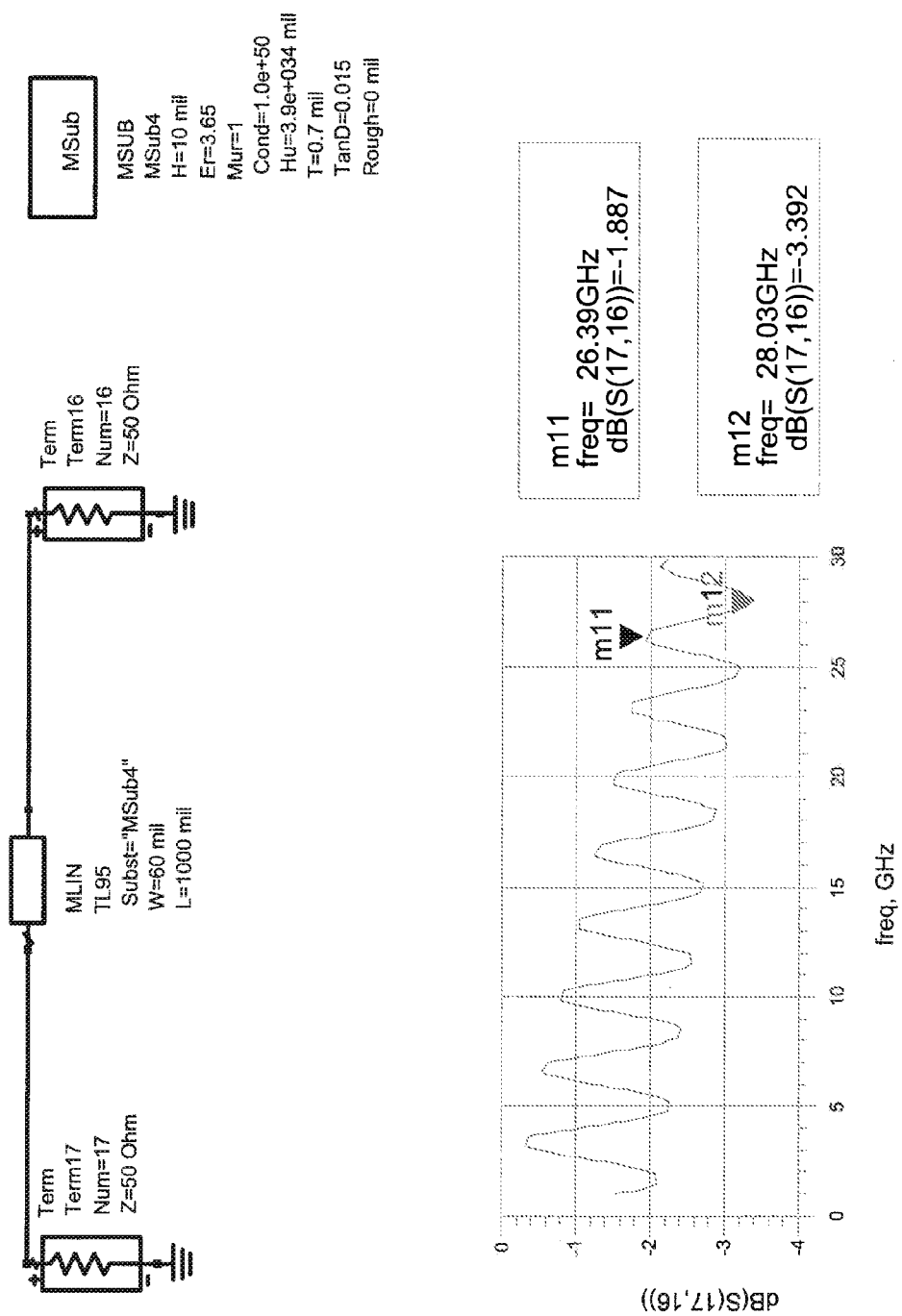
FIGS. 3A thru 3D depict a comparison of the exemplary loss tangent method according to some embodiments of the present invention compared to the convention resonator methods.
Figure 3B:
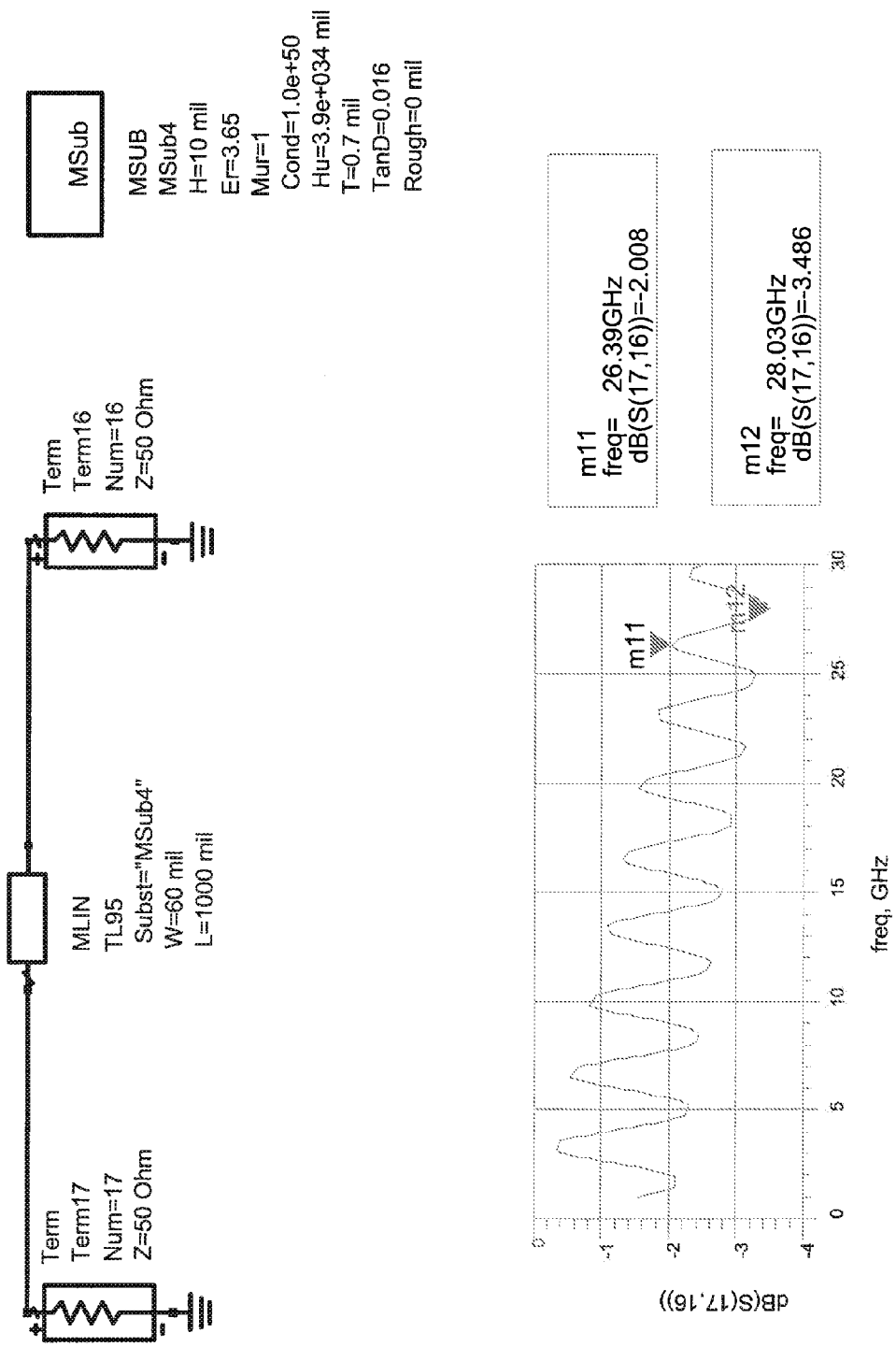

FIGS. 3A thru 3D depict a comparison of the exemplary loss tangent method according to some embodiments of the present invention compared to the convention resonator methods. FIGS. 3A and 3B show a modeled (approximately) 31 ohm microstrip transmission on an approximately 10 mil thick Nelco 4000 softboard substrate with a dielectric loss tangent of 0.015 and 0.016 respectively. These models demonstrate the methods according to some embodiments of the present invention. Marker m11 in FIG. 3A shows an insertion loss of 1.89 dB at 26.39 GHz for a substrate loss tangent of 0.015. Marker m11 in FIG. 3B shows an insertion loss of 2.008 at 26.39 GHz for a substrate loss tangent of 0.016. Thus, for a slight difference in loss tangent, a measurable difference can be seen at high signal levels.

Figure 3C:
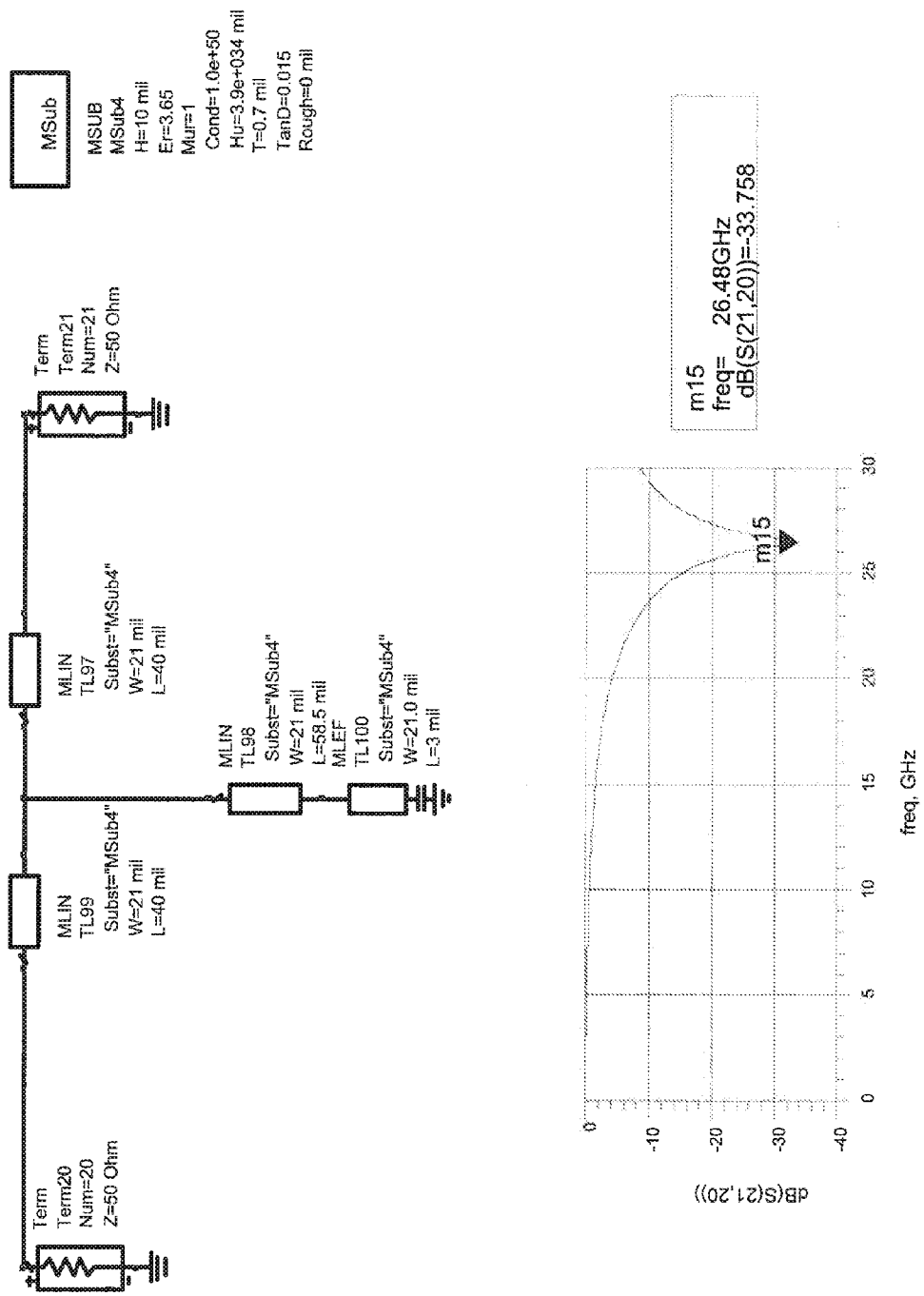
Figure 3D:
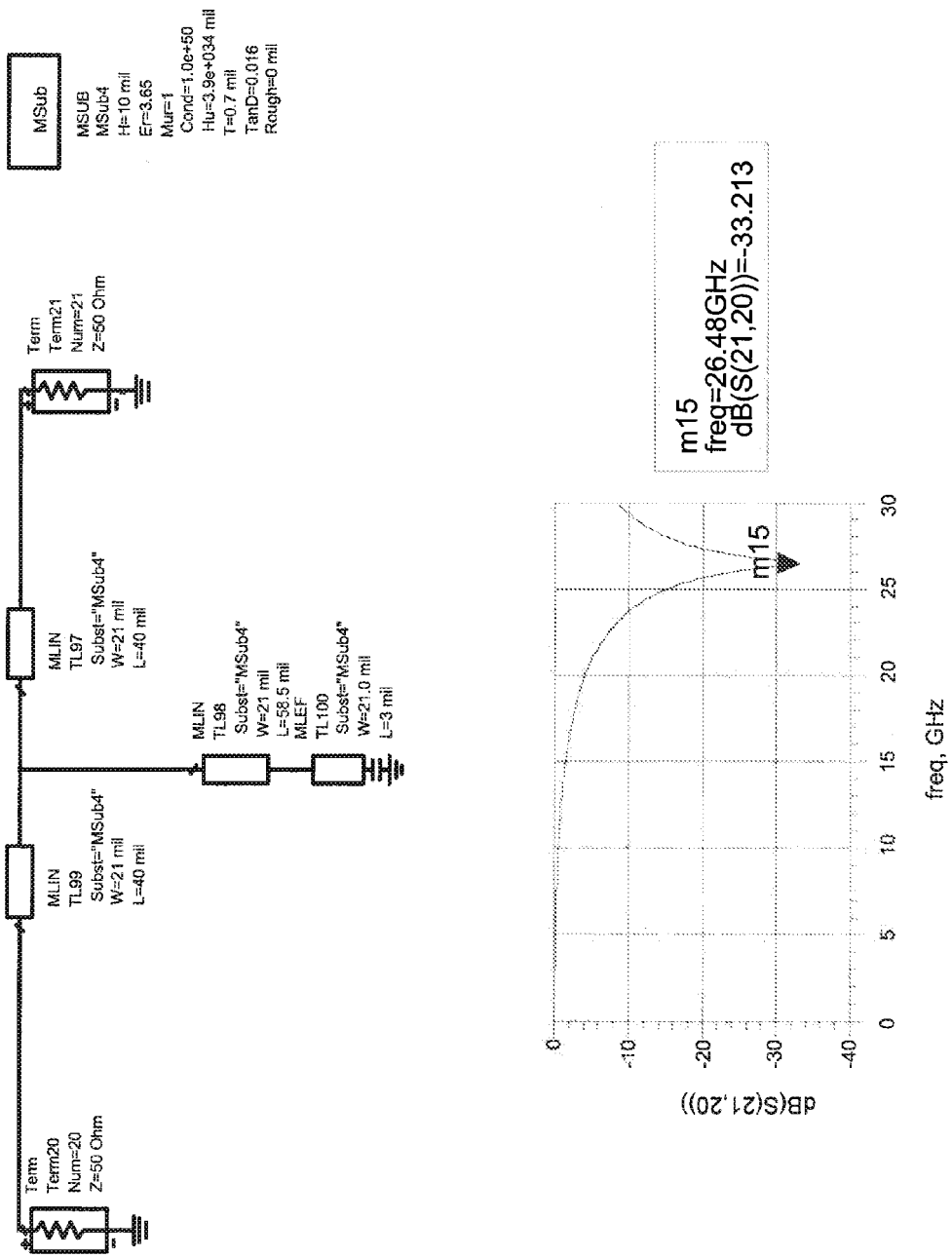

FIGS. 3C and 3D show a modeled microstrip transmission line tee on a 10 mil thick Nelco 4000 softboard substrate with a dielectric loss tangent of 0.015 and 0.016 respectively. These models demonstrate the embodiment of conventional resonant techniques for dielectric loss tangent extraction. Marker m15 in FIG. 3C shows an insertion loss −33.758 dB at 26.48 GHz for a substrate loss tangent of 0.015. Marker m15 in FIG. 3D shows an insertion loss of −33.213 dB at 26.48 GHz for a substrate loss tangent of 0.016. These insertion loss signal levels are extremely low at the resonant points and very difficult to measure accurately with existing test capability particularly at higher frequencies. There are also added parasitic effect such as open transmission line end radiation which further complicates the extraction of the dielectric loss tangent.

Figure 4:
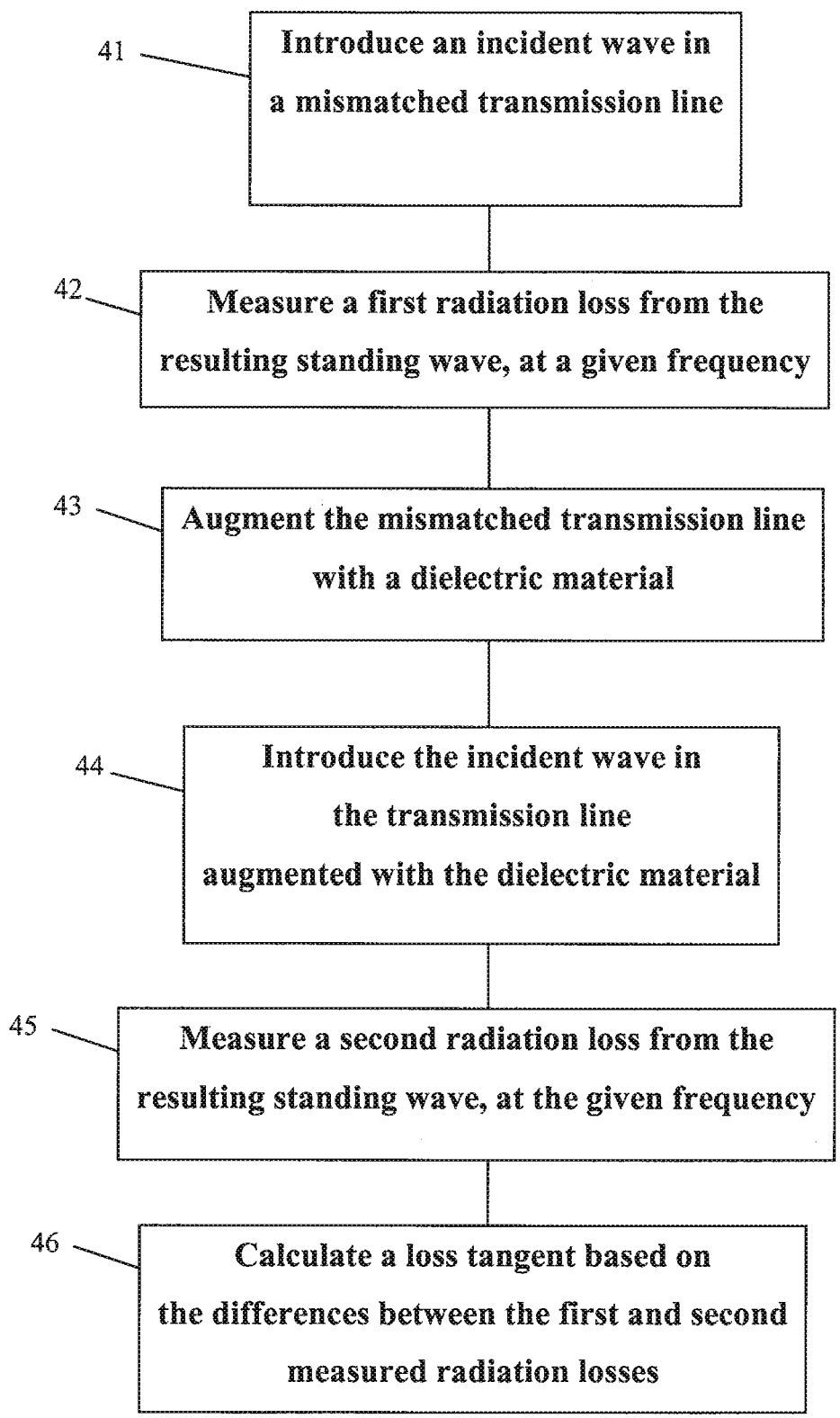
FIG. 4 illustrates an exemplary process flow for characterizing the dielectric loss tangent of a dielectric material, according to some embodiments of the present invention.

FIG. 4 illustrates an exemplary process flow for characterizing the dielectric loss tangent of a dielectric material, according to some embodiments of the present invention. As shown in block 41, an incident wave in introduced in mismatched transmission line thru a RF signal generator. Due to the impedance mismatch of the transmission line, a standing wave is generated in the transmission line. A first insertion loss is measured from the resulting standing wave, at one or more given frequencies, as shown in block 42. The mismatched transmission line is supplied or augmented with a dielectric material in block 43. The dielectric material may be coated or be measured across a substrate.

In block 44, the incident wave is introduced again in the transmission line supplied or augmented with the dielectric material. A second insertion loss is measured from the resulting standing wave, at the one or more given frequencies, as shown in block 45. The order of the first and second insertion loss measurements can be reversed. That is, the loss measurement may be first taken from the transmission line supplied or augmented with the dielectric material and then a second loss measurement may be taken from the transmission line without the dielectric material. The difference between the two loss measurements establishes the insertion loss due to the dielectric material. The loss tangent of dielectric material is then calculated based on the differences between the first and second measurements according to known formulas or techniques. For example, an electromagnetic simulation computer program may be used to derive the loss tangent from the measured insertion loss.

The loss tangent characterization method of the present invention can be applied for dielectric substrates and dielectric coatings.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method for characterizing dielectric loss tangent of a coating of a dielectric material, the method comprising:
   electronically introducing an incident wave in a mismatched transmission line;
   electronically measuring a first insertion loss from a first resulting standing wave, at a given frequency;
   augmenting the mismatched transmission line with the dielectric coating material;
   electronically introducing the incident wave in the transmission line augmented with the dielectric material;
   electronically measuring a second insertion loss from a second resulting standing wave, at the given frequency; and
   electronically calculating the dielectric loss tangent of the coating based on the differences between the first and second measured insertion losses.

2. The method of claim 1, wherein augmenting the mismatched transmission line with the dielectric material comprises placing a dielectric substrate in the mismatched transmission line.

3. The method of claim 1, wherein augmenting the mismatched transmission line with the dielectric material comprises placing a dielectric coating in the mismatched transmission line.

4. The method of claim 1, wherein electronically calculating the dielectric loss tangent comprises electronically providing the differences between the first and second measured insertion losses to an electromagnetic simulation computer program to calculate the dielectric loss tangent.

5. The method of claim 4, further comprising electronically validating accuracy of a model of the transmission line for the simulation computer program.

6. The method of claim 1, wherein electronically measuring a first insertion loss from the first resulting standing wave comprises measuring the first insertion loss from peaks and valleys of the first resulting standing wave.

7. The method of claim 1, wherein electronically measuring a second insertion loss from the second resulting standing wave comprises measuring the second insertion loss from peaks and valleys of the second resulting standing wave.

8. The method of claim 1, wherein the transmission line is a microstrip transmission line with an approximately 31.5 ohm impedance.

9. The method of claim 1, wherein the dielectric material is an approximately 2 mil height GaAs substrate.

10. The method of claim 1, wherein the dielectric material is an approximately 10 mil thick softboard substrate.

11. The method of claim 1, wherein the given frequency is higher than 22 GHz.

12. A method for characterizing dielectric loss tangent of a dielectric material, the method comprising:
   electronically modeling a mismatched transmission line for an electromagnetic simulation computer program;
   electronically receiving a first input representative of introducing an incident wave in the modeled mismatched transmission line;
   electronically measuring a first insertion loss from a first resulting standing wave, at a given frequency;
   electronically receiving a second input representative of the dielectric material for augmenting the modeled mismatched transmission line;

electronically receiving a third input representative of introducing the incident wave in the modeled transmission line augmented with the dielectric material;

electronically measuring a second insertion loss from a second resulting standing wave, at the given frequency; and electronically calculating the dielectric loss tangent based on the differences between the first and second measured insertion losses by the electromagnetic simulation computer program.

13. The method of claim 12, wherein augmenting the modeled mismatched transmission line with the dielectric material comprises placing a dielectric substrate in the mismatched transmission line.

14. The method of claim 12, wherein augmenting the modeled mismatched transmission line with the dielectric material comprises placing a dielectric coating in the mismatched transmission line.

15. The method of claim 12, further comprising validating accuracy of the modeled transmission line.

16. The method of claim 12, wherein the transmission line is a microstrip transmission line with an approximately 31.5 ohm impedance.

17. The method of claim 12, wherein the dielectric material is an approximately 2 mil height GaAs substrate.

18. The method of claim 12, wherein the dielectric material is an approximately 10 mil thick softboard substrate.

19. The method of claim 12, wherein electronically measuring a first insertion loss from the first resulting standing wave and electronically measuring a second insertion loss from the second resulting standing wave comprise electronically measuring the first insertion loss from peaks and valleys of the first resulting standing wave and electronically measuring the second insertion loss from peaks and valleys of the second resulting standing wave.

20. A non-transitory computer storage medium having a plurality of computer instructions for characterizing dielectric loss tangent of a dielectric material stored therein, the plurality of computer instructions when executed by one or more computers performing the following steps:

modeling a mismatched transmission line;

introducing an incident wave in the modeled mismatched transmission line;

measuring a first insertion loss from a first resulting standing wave, at a given frequency;

augmenting the modeled mismatched transmission line with the dielectric material;

introducing the incident wave in the modeled transmission line augmented with the dielectric material;

measuring a second insertion loss from a second resulting standing wave, at the given frequency; and calculating the dielectric loss tangent based on the differences between the first and second measured insertion losses.

* * * * *